United States Patent
Alshinnawi et al.

(10) Patent No.: US 9,198,325 B2
(45) Date of Patent: Nov. 24, 2015

(54) TARGETED COOLING TO SPECIFIC OVERHEATING RACK-MOUNTED SERVERS

(71) Applicant: Lenovo Enterprise Solutions (Singapore) Pte. Ltd., Singapore (SG)

(72) Inventors: Shareef F. Alshinnawi, Durham, NC (US); Gary D. Cudak, Creedmoor, NC (US); Edward S. Suffern, Chapel Hill, NC (US); J. Mark Weber, Wake Forest, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 346 days.

(21) Appl. No.: 13/778,656

(22) Filed: Feb. 27, 2013

(65) Prior Publication Data

US 2014/0240919 A1  Aug. 28, 2014

(51) Int. Cl.
*G05D 23/00* (2006.01)
*H05K 7/20* (2006.01)

(52) U.S. Cl.
CPC ........ *H05K 7/20145* (2013.01); *H05K 7/20836* (2013.01)

(58) Field of Classification Search
None
See application file for complete search history.

(56) References Cited

U.S. PATENT DOCUMENTS

| | | | |
|---|---|---|---|
| 248,732 | A | 10/1881 | Garratt |
| 4,612,979 | A | 9/1986 | Heitzig |
| 5,636,103 | A | 6/1997 | Bushner |
| 7,352,575 | B2 | 4/2008 | Anderl et al. |
| 7,450,377 | B2 | 11/2008 | Matsumoto et al. |
| 7,639,499 | B1 | 12/2009 | Campbell et al. |
| 7,746,634 | B2 | 6/2010 | Hom et al. |
| 7,907,402 | B2 | 3/2011 | Caveney |
| 7,944,694 | B2 | 5/2011 | Campbell et al. |
| 7,961,475 | B2 | 6/2011 | Campbell et al. |
| 7,986,526 | B1 | 7/2011 | Howard et al. |
| 8,144,464 | B2 | 3/2012 | Vanderveen et al. |
| 8,154,870 | B1 | 4/2012 | Czamara et al. |
| 8,257,155 | B2 | 9/2012 | Lewis, II |
| 2004/0217072 | A1* | 11/2004 | Bash et al. ........... 211/26 |
| 2004/0218355 | A1 | 11/2004 | Bash et al. |

(Continued)

FOREIGN PATENT DOCUMENTS

DE  10311380 A1  10/2003

OTHER PUBLICATIONS

U.S. Appl. No. 13/684,738, filed Nov. 26, 2012—Specification and Drawings.
Inova Products Inc., "The Activent: Wireless Temperature Controlled Air Vent System," Copyright Nov. 2009, Inova Products Inc., pp. 1-3, Retrieved Feb. 18, 2013, <http://www.theactivent.com>.

(Continued)

*Primary Examiner* — Sean Shechtman
(74) *Attorney, Agent, or Firm* — Law Office of Jim Boice (57) ABSTRACT

A system selectively cools a set of at least one rack-mounted server in a chassis. The system comprises: a chassis; a chassis manager; a set of at least one thermal sensor coupled to each rack-mounted server in the chassis; a cold air source; a cold air conduit coupled to the cold air source; a plurality of cold air valves coupled to the cold air conduit; and an expandable tube of flexible memory material coupled to each of the plurality of cold air valves, where the expandable tube inflates with cold air from the cold air source to expose directional holes, and thus cold air, across a specific predetermined sub-area of a particular overheating rack-mounted server in response to the chassis manager detecting that the particular overheating rack-mounted server is exceeding a predetermined temperature.

15 Claims, 6 Drawing Sheets

(56) References Cited

U.S. PATENT DOCUMENTS

| | | | |
|---|---|---|---|
| 2004/0264124 A1* | 12/2004 | Patel et al. | 361/686 |
| 2005/0237716 A1 | 10/2005 | Chu et al. | |
| 2008/0002362 A1 | 1/2008 | Ishimine | |
| 2008/0239659 A1 | 10/2008 | Kundapur | |
| 2009/0308093 A1 | 12/2009 | Khalili et al. | |
| 2010/0103614 A1* | 4/2010 | Campbell et al. | 361/689 |
| 2010/0313590 A1 | 12/2010 | Campbell et al. | |
| 2010/0315788 A1 | 12/2010 | Vanderveen et al. | |
| 2011/0205705 A1 | 8/2011 | Graybill et al. | |
| 2011/0290448 A1 | 12/2011 | Campbell et al. | |
| 2011/0315353 A1* | 12/2011 | Campbell et al. | 165/104.31 |

OTHER PUBLICATIONS

Anonymous, "Kwikduct Product Sheet," KC Amalgamated, LLC, pp. 1, Retrieved Feb. 18, 2013, <http://kwikduct.com/documents.htm>.

Anonymous, "Liebert XDV, XD Racktop Cooling Module, 8.8-10KW," Emerson Network Power, pp. 1, Retrieved Feb. 18, 2013, <http://www.emersonnetworkpower.com/en-US/Products/PrecisionCooling/HighDensityModularCooling/Refrigerant-Based/Pages/LiebertXDV.aspx>.

U.S. Appl. No. 13/765,369—Non-Final Office Action Mailed Apr. 6, 2015.

\* cited by examiner

TARGETED COOLING TO SPECIFIC OVERHEATING RACK-MOUNTED SERVERS

BACKGROUND

The present disclosure relates to the field of computers, and specifically to rack-mounted computers in a chassis. Still more particularly, the present disclosure relates to cooling rack-mounted computers in a chassis.

A chassis is a housing that holds multiple rack-mounted computers, also known as servers, also known as rack-mounted servers. Each rack-mounted server is an autonomous or semi-autonomous computing system, which is able to communicate with other rack-mounted servers within and outside of the chassis.

SUMMARY

In one embodiment of the present invention, a system selectively cools a set of at least one rack-mounted server in a chassis. The system comprises: a chassis; a chassis manager; a set of at least one thermal sensor coupled to each rack-mounted server in the chassis; a cold air source; a cold air conduit coupled to the cold air source; a plurality of cold air valves coupled to the cold air conduit; and an expandable tube of flexible memory material coupled to each of the plurality of cold air valves, where the expandable tube inflates with cold air from the cold air source to expose directional holes, and thus cold air is directed across a specific predetermined sub-area of a particular overheating rack-mounted server in response to the chassis manager detecting that the particular overheating rack-mounted server is exceeding a predetermined temperature.

In one embodiment of the present invention, a method and/or computer program product selectively cools a set of at least one rack-mounted server in a chassis. A thermal reading is received from a set of at least one thermal sensor coupled to each rack-mounted server in a chassis, where the set of at least one thermal sensor communicates a real time temperature of each rack-mounted server from the multiple rack-mounted servers to the chassis manager. One or more processors detects that a particular overheating rack-mounted server from the multiple rack-mounted servers is exceeding a predetermined temperature. In response to the chassis manager detecting that the particular overheating rack-mounted server is exceeding the predetermined temperature, a message is generated and transmitted to open a cold air valve that is proximate to the particular overheating rack-mounted server, where the cold air valve selectively inflates an expandable tube of flexible memory material with cold air to direct to the cold air to a specific predetermined sub-area of the particular overheating rack-mounted server in the chassis.

DETAILED DESCRIPTION

As will be appreciated by one skilled in the art, some or all of the present disclosure may be embodied as a system, method or computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, some or all of the features described in the present disclosure may take the form of a computer program product embodied in one or more computer-readable medium(s) having computer-readable program code embodied thereon.

Any combination of one or more computer-readable medium(s) may be utilized. The computer-readable medium may be a computer-readable signal medium or a computer-readable storage medium. A computer-readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer-readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer-readable storage medium may be any tangible medium that can contain or store a program for use by or in connection with an instruction execution system, apparatus, or device.

A computer-readable signal medium may include a propagated data signal with computer-readable program code embodied therein, for example, in baseband or as part of a carrier wave. Such a propagated signal may take any of a variety of forms, including, but not limited to, electro-magnetic, optical, or any suitable combination thereof. A computer-readable signal medium may be any computer-readable medium that is not a computer-readable storage medium and that can communicate, propagate, or transport a program for use by or in connection with an instruction execution system, apparatus, or device.

Program code embodied on a computer-readable medium may be transmitted using any appropriate medium, including but not limited to wireless, wireline, optical fiber cable, RF, etc., or any suitable combination of the foregoing.

Figure 1:
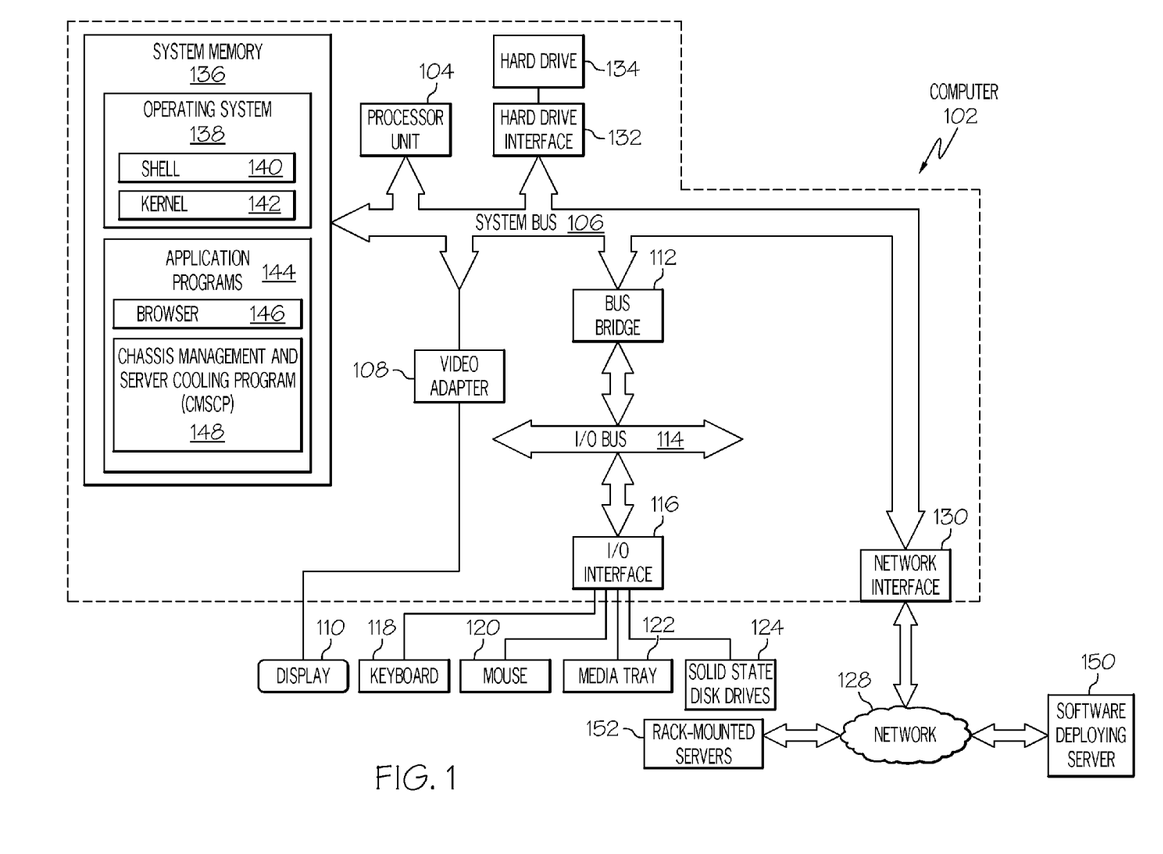
FIG. 1 depicts an exemplary computer that may be used in implementing one or more components described in the present disclosure.
Figure 2:
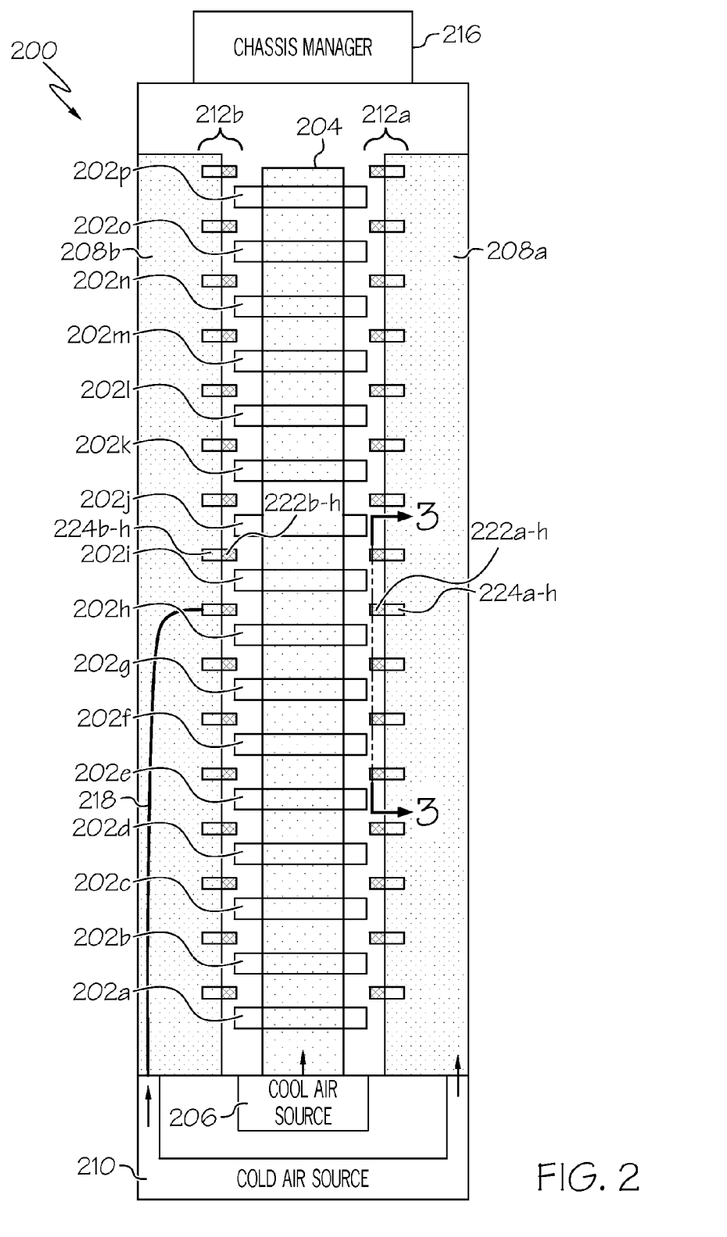
FIG. 2 illustrates an exemplary chassis in which overheating rack-mounted servers are targeted for auxiliary cooling by using cold air from a cold air plenum.

With reference now to the figures, and in particular to FIG. 1, there is depicted a block diagram of an exemplary computer 102, which may be utilized by the present disclosure to manage multiple rack-mounted servers by acting as a chassis manager, which is a processor-based computing system (e.g., that comprises one or more processors) such as chassis manager 216 depicted in FIG. 2. Thus, the architecture depicted in FIG. 1 for computer 102 may be utilized in software deploying server 150 and/or rack-mounted servers 152 and/or chassis manager 216.

Computer 102 includes a processor unit 104 that is coupled to a system bus 106. Processor unit 104 may utilize one or more processors, each of which has one or more processor cores. A video adapter 108, which drives/supports a display 110, is also coupled to system bus 106. System bus 106 is coupled via a bus bridge 112 to an input/output (I/O) bus 114. An I/O interface 116 is coupled to I/O bus 114. I/O interface 116 affords communication with various I/O devices, including a keyboard 118, a mouse 120, a media tray 122 (which may include storage devices such as CD-ROM drives, multimedia interfaces, etc.), and high-speed solid state disk drives 124. While the format of the ports connected to I/O interface 116 may be any known to those skilled in the art of computer architecture, in a preferred embodiment some or all of these ports are universal serial bus (USB) ports.

As depicted, in one embodiment, computer 102 is able to communicate via network 128 using a network interface 130. Network 128 may be an external network such as the Internet, or an internal network such as an Ethernet or a virtual private network (VPN). Network 128 provides a communication link to external computing devices, such as software deploying server 150 and/or rack-mounted servers 152.

A hard drive interface 132 is also coupled to system bus 106. Hard drive interface 132 interfaces with a hard drive 134. In a preferred embodiment, hard drive 134 populates a system memory 136, which is also coupled to system bus 106. System memory is defined as a lowest level of volatile memory in computer 102. This volatile memory includes additional higher levels of volatile memory (not shown), including, but not limited to, cache memory, registers and buffers. Data that populates system memory 136 includes computer 102's operating system (OS) 138 and application programs 144.

OS 138 includes a shell 140, for providing transparent user access to resources such as application programs 144. Generally, shell 140 is a program that provides an interpreter and an interface between the user and the operating system. More specifically, shell 140 executes commands that are entered into a command line user interface or from a file. Thus, shell 140, also called a command processor, is generally the highest level of the operating system software hierarchy and serves as a command interpreter. The shell provides a system prompt, interprets commands entered by keyboard, mouse, or other user input media, and sends the interpreted command(s) to the appropriate lower levels of the operating system (e.g., a kernel 142) for processing. Note that while shell 140 is a text-based, line-oriented user interface, the present disclosure will equally well support other user interface modes, such as graphical, voice, gestural, etc.

As depicted, OS 138 also includes kernel 142, which includes lower levels of functionality for OS 138, including providing essential services required by other parts of OS 138 and application programs 144, including memory management, process and task management, disk management, and mouse and keyboard management.

Application programs 144 include a renderer, shown in exemplary manner as a browser 146. Browser 146 includes program modules and instructions enabling a world wide web (WWW) client (i.e., computer 102) to send and receive network messages to the Internet using hypertext transfer protocol (HTTP) messaging, thus enabling communication with software deploying server 150 and other described computer systems.

Application programs 144 also include a chassis management and server cooling program (CMSCP) 148, which, when executed, performs some or all of the processes described in FIGS. 2-6. In one embodiment, CMSCP 148 is downloadable from software deploying server 150 in an on-demand basis, such that units of code are downloaded only when needed. In another embodiment, some or all of the processes executed by CMSCP 148 are performed by software deploying server 150 itself, thus minimizing the use of resources within computer 102.

The hardware elements depicted in computer 102 are not intended to be exhaustive, but rather are representative to highlight essential components required by the present disclosure. For instance, computer 102 may include alternate memory storage devices such as magnetic cassettes, digital versatile disks (DVDs), Bernoulli cartridges, and the like. These and other variations are intended to be within the spirit and scope of the present disclosure.

With reference now to FIG. 2, an exemplary chassis 200 in which overheating rack-mounted servers are targeted for auxiliary cooling in accordance with the present invention is presented. Chassis 200 holds multiple rack-mounted servers, depicted as rack-mounted servers 202a-202p (where "p" is an integer). Positioned adjacent to the rack-mounted servers 202a-202p is a cool air plenum 204, which provides primary cooling air from a cool air source 206. In one embodiment, cool air plenum 204 is a semi-enclosed plenum within the chassis 200, which provides cooling air to the rack-mounted servers 202a-202p via passage holes (not shown) on at least one side of the cool air plenum 204. In another embodiment, cool air plenum 204 is ambient air within or adjacent to the chassis 200. In either embodiment, cool air is provided by a positive pressure source of cool air, depicted as cool air source 206, which provides primary cooling air to fans (not depicted) mounted on (e.g., on a heat sink) each of the rack-mounted servers 202a-202p, or adjacent to one or more (i.e., in a "zone") of the rack-mounted servers 202a-202p.

During normal operation (i.e., error free operation of the rack-mounted servers 202a-202p and thus operating within nominal temperature ranges), the cooling air from the cool air plenum 204 is sufficient to keep the rack-mounted servers 202a-202p operating at nominal (normal) temperatures. However, occasionally one of the rack-mounted servers, such as rack-mounted server 202h, exceeds its nominal operating temperature. For example, a processor mounted to rack-mounted server 202h may be overheating, despite the availability of primary cooling air from the cool air plenum 204 and the heat sink/cooling fan(s) associated with rack-mounted server 202h. One solution to this overheating is to simply "turn up" the speed of the cooling fan(s) associated with rack-mounted server 202h. However, this results in a drop in static pressure and dynamic pressure within the cool air plenum 204, thus robbing rack-mounted servers 202g-202p of sufficient primary cooling air.

In order to avoid increasing the speed of the cooling fan(s) dedicated to cooling rack-mounted server 202h, the present invention utilizes auxiliary cold air plenums 208a-208b, which provide auxiliary cold air from a cold air source 210 (e.g., an air conditioning system that provides secondary cooling air). Note that while the cool air source 206 and the cold air source 210 both are air conditioning (i.e., air chilling) systems, the temperature of the air provided by these two sources may be the same as one another or different from one another.

Cold air from the cold air plenums 208a-208b is selectively directed to the overheating rack-mounted server 202h by one of the plurality of cold air valve units 212a-212b. Each of the cold air valve units 212a-212b is made up of a cold air valve, to which is attached an expandable tube of flexible memory material, as described in detail in FIG. 4-FIG. 5 below.

As described herein, if the chassis manager 216 receives a signal (e.g., from a thermal sensor mounted on the overheating rack-mounted server 202*h*) indicating that rack-mounted server 202*h* is overheating, the chassis manager 216 (e.g., by executing instructions from CMSCP 148 depicted in FIG. 1) causes one or more of the cold air valves in the plurality of cold air valve units 212*a*-212*b* to open, thus allowing cold air from one or both of the cold air plenums 208*a*-208*b* to be directed over the overheating rack-mounted server 202*h*. For example, by opening the cold air valve 224*a*-*h*, cold air is directed from the cold air plenum 208*a* over the overheating rack-mounted server 202*h* via an expandable tube of flexible memory material 222*a*-*h*. In one embodiment, cold air is directed from the cold air source 210 to the overheating rack-mounted server 216 via a flexible cold air tube 218, which provides cold air to the illustrated expandable tube of flexible memory material 222*b*-*h* via the cold air valve 224*b*-*h*. In either embodiment, providing cold air (under a pressure that is greater than the ambient air pressure surrounding the overheating rack-mounted server 202*h*) causes the expandable tube of flexible memory material (e.g., the depicted expandable tube of flexible memory material 222*a*-*h* or expandable tube of flexible memory material 222*b*-*h*) to expand/inflate, as described in further detail below.

In one embodiment, only a single cold air valve 224*a*-*h* is opened proximate to the zone of the overheating rack-mounted server 202*h*, leaving opening of the other cold air valve 224*b*-*h* in reserve for additional cooling to the overheating rack-mounted server 202*h*. Alternatively, both cold air valve 224*a*-*h* and cold air valve 224*b*-*h* can be simultaneously opened to quickly cool down the overheating rack-mounted server 202*h*.

Figure 3:
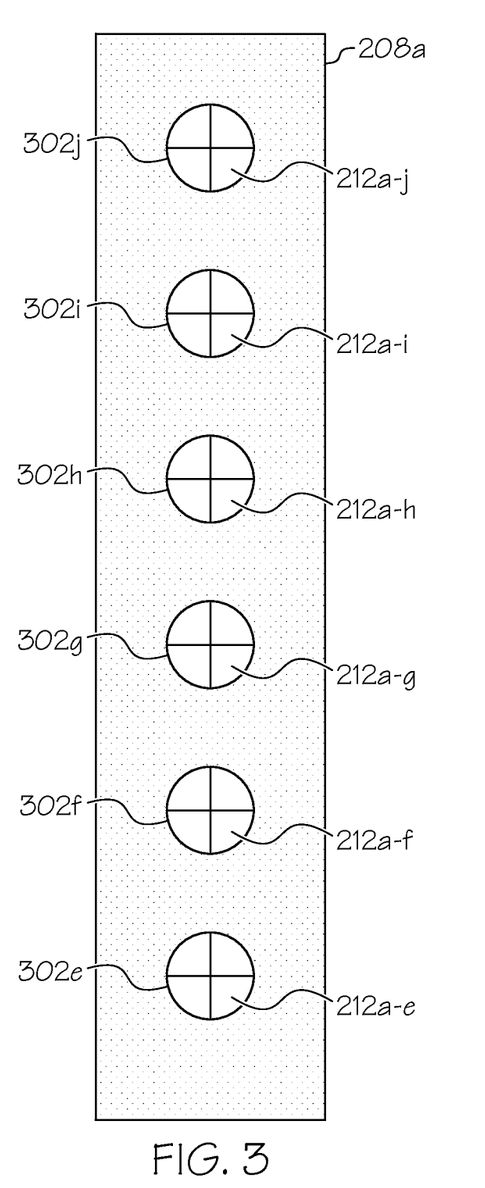
FIG. 3 depicts additional detail of openings in the cold air plenum illustrated in FIG. 2.

With reference to FIG. 3, additional detail of the identified section of cold air plenum 208*a* is presented. As depicted in FIG. 3, cold air plenum 208*a* has a series of orifices (including the depicted orifices 302*e*-302*j*), which align with respective rack-mounted servers 202*e*-202*j*. Each of the orifices holds one of the cold air valve units 212*a* (depicted as cold air valve units 212*a*-*e* to 212*a*-*j*.)

Figure 4:
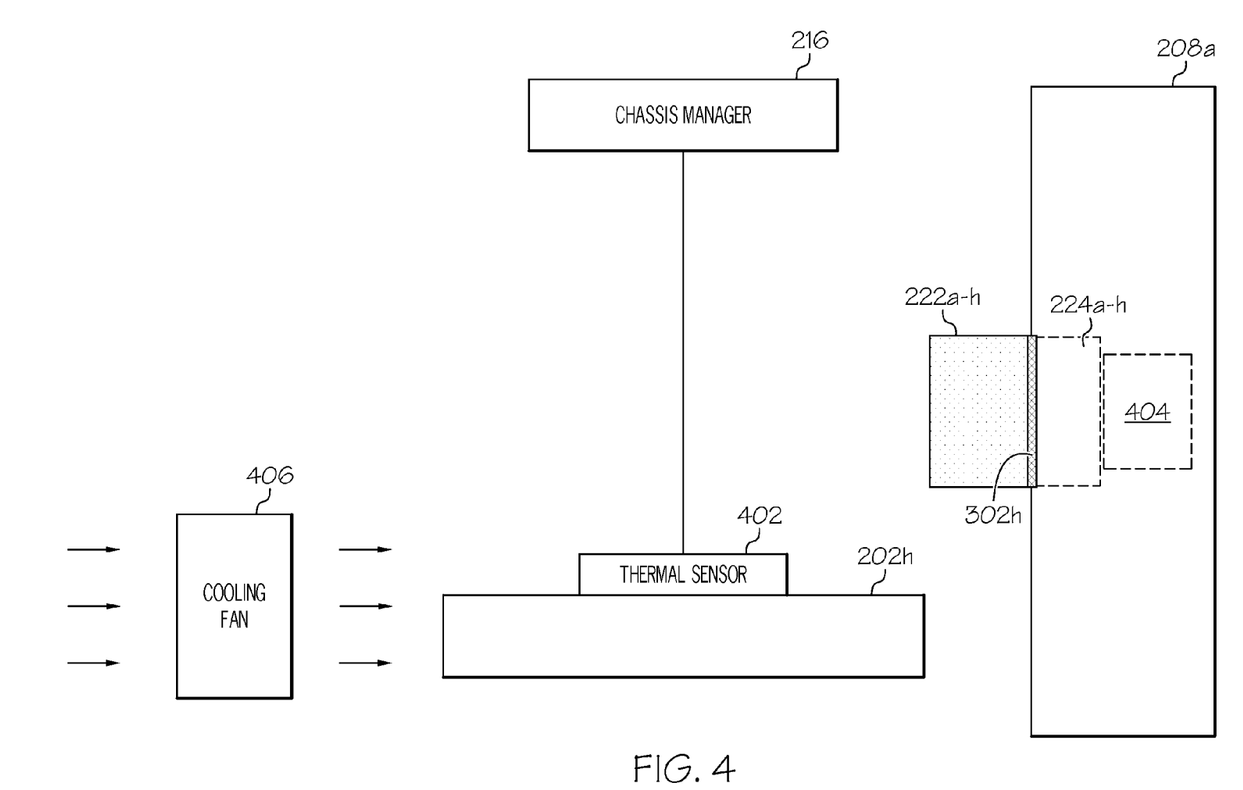
FIG. 4 illustrates additional detail of cold air units depicted in FIG. 2 in a relaxed uninflated state.

With reference to FIG. 4, assume that a thermal sensor 402 dedicated to (e.g., placed upon or in close proximity to) rack-mounted server 202*h* detects that the rack-mounted server 202*h* is operating within a normal temperature range (i.e., is not overheating). That is, a cooling fan 406, which is dedicated to a set of rack-mounted servers that includes the particular rack-mounted server 202*h*, nominally operates at a predetermined speed. In one embodiment, the cooling fan 406 is prevented by the chassis manager 216 from increasing this predetermined speed unless a determination by the chassis manager 216 (using readings from the thermal sensor 402) shows that the cold air being supplied by the cold air source 206 (shown in FIG. 2) is unable to bring a particular overheating rack-mounted server below the predetermined temperature.

If the chassis manager 216 receives a signal from thermal sensor 402 indicating that the rack-mounted server 202*h* is operating at a nominal condition (i.e., is not overheating), then the chassis manager 216 instructs the cold air valve 224*a*-*h* to remain closed (or at least allows the cold air valve 224*a*-*h* to remain in its normally closed position). This closed position for cold air valve 224*a*-*h* results in 1) no air being released from cold air plenum 208*a* (or alternatively, from a cold air tube such as cold air tube 218 depicted in FIG. 1), and 2) the expandable tube of flexible memory material 222*a*-*h* remaining uninflated, and thus out of the way of any moving parts (not shown) that may be above the rack-mounted server 202*h*.

Figure 5:
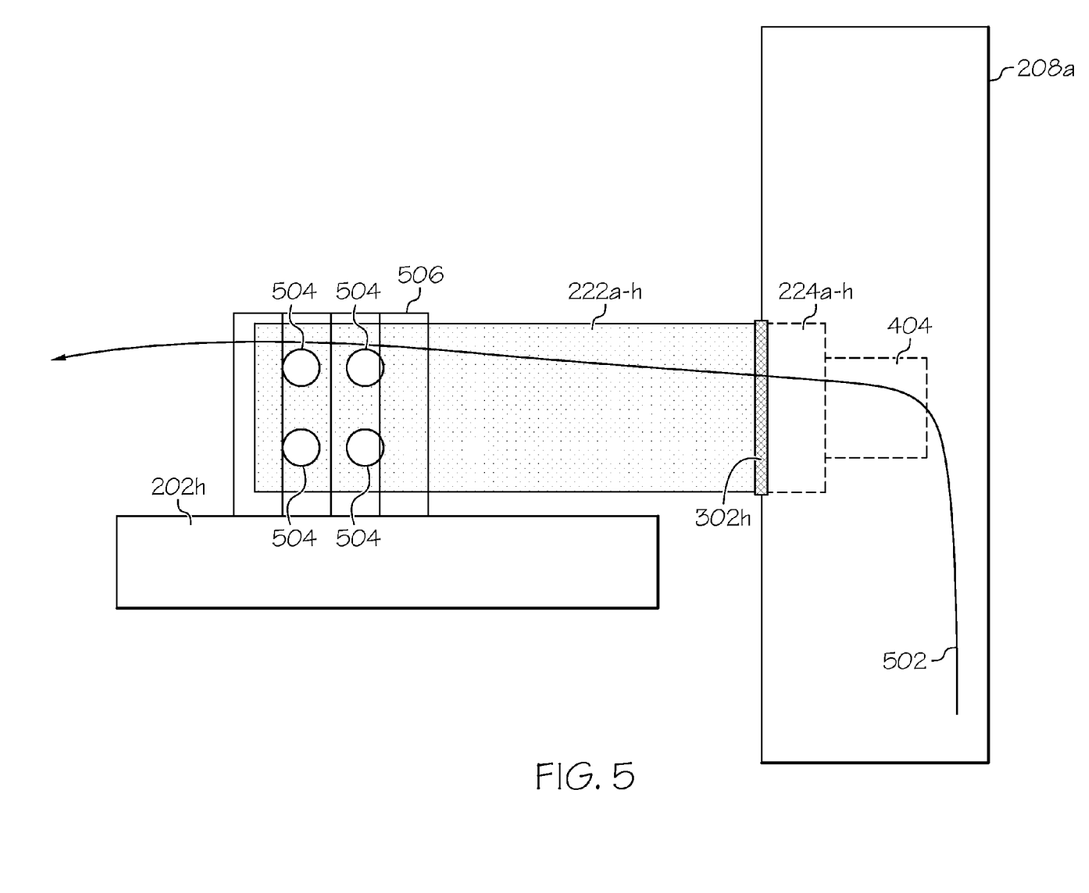
FIG. 5 depicts the expandable tube of flexible memory, illustrated in FIG. 4, in an inflated state.

However, with reference to FIG. 5, assume that the thermal sensor 402 depicted in FIG. 4, and dedicated to rack-mounted server 202*h*, detects that the rack-mounted server 202*h* is operating above a predetermined temperature or temperature range (i.e., is overheating). The chassis manager 216 depicted in FIG. 4 receives a new signal from thermal sensor 402 indicating this abnormal condition, and thus opens cold air valve 224*a*-*h*. This open position for cold air valve 224*a*-*h* results in 1) cold air being released from cold air plenum 208*a* (or alternatively, from a cold air tube such as cold air tube 218 depicted in FIG. 1), and 2) the expandable tube of flexible memory material 222*a*-*h* inflating, as depicted. This inflation of the expandable tube of flexible memory material 222*a*-*h* causes holes 504 to open up, allowing the cold air 502 to be precisely directed to a predetermined sub-area (e.g., the processor's heat sink 506) on the overheating rack-mounted server 202*h*. Note that the cold air valve 224*a*-*h* includes an electromechanical (controlled by an electrical motor), pneumomechanical (controlled by a pneumatic motor), or other mechanical controls that activate a motor, which is not shown but is part of the cold air valve 224*a*-*h*, to open and close upon receipt of a "open" control signal from the chassis manager 216.

Note that the expandable tube of flexible memory material 222*a*-*h* is able to expand/retract by any of a variety of manners. For example, expandable tube of flexible memory material 222*a*-*h* may roll up and down (as a coiled flat hose), or it may expand and contract in an accordion manner, or it may expand and contract in a complex rotational movement along the linear axis of the expandable tube of flexible memory material 222*a*-*h*.

As depicted in FIG. 4 and FIG. 5, in one embodiment a separate fluid moving fan 404 is coupled to the cold air valve 224*a*-*h*, thus providing additional pressure to force the cold air 502 into the expandable tube of flexible memory material 222*a*-*h*.

Note that the cold air hose 218 is depicted as being coupled to a single cold air valve 224*b*-*h*. In one embodiment, every cold air valve unit from cold air valve units 212*a*-212*b* has a dedicated cold air hose (such as cold air hose 218) coupled to its cold air valve (which is part of each cold air valve unit). Note also that the cold air hoses may traverse through a cold air plenum, as depicted in FIG. 2, or they may traverse from the cold air source 210 to the cold air valve units within or outside of any structure, presuming that the presence of these cold air hoses does not impede the operation of such a structure.

Note that the cold air plenums and the cold air hoses described herein are both examples of cold air conduits that may be utilized to provide fluid communication between a cold air source and one of the plurality of cold air valves described herein (including, but not limited to, the depiction shown in FIG. 2).

Figure 6:
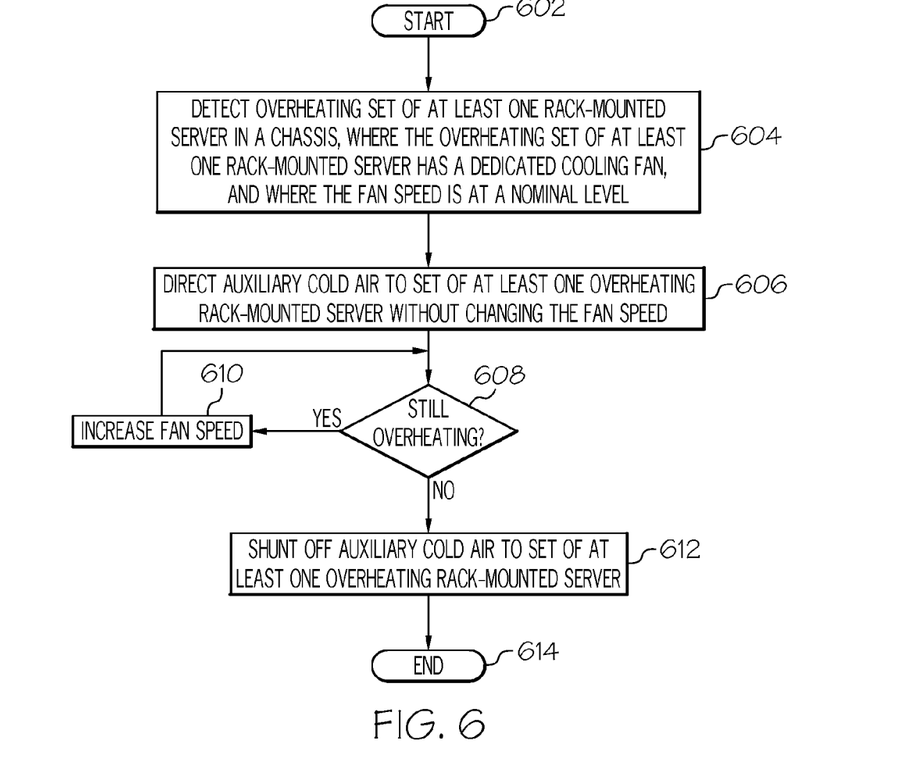
FIG. 6 is a high level flow chart of one or more exemplary steps taken by one or more processors to selectively provide additional cooling to an overheating rack-mounted server within a chassis.

With reference now to FIG. 6, a high level flow chart of one or more exemplary steps taken by a processor to provide selective additional cooling to an overheating rack-mounted server within a chassis is presented. After initiator block 602, overheating is detected in a set of at least one rack-mounted server in a chassis, where the overheating set of at least one rack-mounted server has a dedicated cooling fan, and where the fan speed is at a nominal level (block 604). That is, one or more processors receives a thermal reading from a set of at least one thermal sensor coupled to each rack-mounted server in a chassis, wherein the set of at least one thermal sensor communicates a real time temperature of each rack-mounted server from the multiple rack-mounted servers to the chassis manager. This enables one or more processors (e.g., within the chassis manager 216 depicted in FIG. 2) to detect that a particular overheating rack-mounted server from the multiple rack-mounted servers is exceeding a predetermined temperature.

As described in block 606, auxiliary cold air (e.g., from the cold air plenums depicted in FIG. 2) is then directed to the overheating rack-mounted server, while not changing the fan speed of any fans that are dedicated to cooling that overheating rack-mounted server. If the overheating rack-mounted server is still overheating (query block 608), even after the auxiliary cold air from the cold air plenum is sent to the overheating rack-mounted server, then the fan speed is increased (block 610). However, if the previously overheating rack-mounted server is now operating within its nominal (e.g., normal) temperature range (query block 608), then the auxiliary cold air (e.g., from the cold air plenum depicted herein) is shunted off from that rack-mounted server (block 612), and the process ends (terminator block 614).

Thus, as described in FIG. 6 and elsewhere in the present specification, one embodiment of the present invention presents a method and/or computer program product for selectively cooling a set of at least one rack-mounted server in a chassis. The method comprises receiving, by one or more processors, a thermal reading from a set of at least one thermal sensor coupled to each rack-mounted server in a chassis, where the set of at least one thermal sensor communicates a real time temperature of each rack-mounted server from the multiple rack-mounted servers to a chassis manager, wherein the chassis manager is a processor-based computing system. One or more processors (e.g., processor(s) within the chassis manager) detect, based on readings from a thermal sensor associated with a particular rack-mounted server, that the particular overheating rack-mounted server from the multiple rack-mounted servers is exceeding a predetermined temperature. In response to the chassis manager detecting that the particular overheating rack-mounted server is exceeding the predetermined temperature, one or more processors generate and transmit a message (e.g., to receiving logic associated with an actuator within a cold air valve) to open a cold air valve that is proximate to the particular overheating rack-mounted server. Opening this cold air valve selectively inflates an expandable tube of flexible memory material with cold air, thus directing the cold air to a specific predetermined sub-area of the particular overheating rack-mounted server in the chassis.

In one embodiment, the cold air that inflates the expandable tube of flexible memory material is from a cold air plenum. In one embodiment, the cold air that inflates the expandable tube of flexible memory material is from a cold air hose that is in fluid communication with the cold air valve.

In one embodiment, at least one cooling fan is dedicated to a set of rack-mounted servers that includes the particular overheating rack-mounted server, where the at least one cooling fan nominally operates at a predetermined speed. In this embodiment, the method further comprises, in response to the cold air delivered from the cold air source being able to bring the particular overheating rack-mounted server below the predetermined temperature, preventing, by one or more processors, the at least one cooling fan from increasing the predetermined speed.

In one embodiment, the method further comprises directing, by one or more processors, a cool air source to provide cooling air to the multiple rack-mounted servers via a cool air plenum. This cool air plenum, which is in fluid communication with the cool air source, is oriented adjacent to the multiple rack-mounted servers. The cool air plenum provides a primary source of cooling air to the multiple rack-mounted servers, and the cold air plenum provides a secondary source of cooling air to the multiple rack-mounted servers, which is used only if the primary source of cooling air is insufficient to keep the particular rack-mounted server from overheating.

Note that the term "fluid" as used herein and in the claims is defined as a non-solid material capable of flowing, such as a liquid or a gas. In one embodiment of the present disclosure, "fluid" refers to a gas, such as atmospheric air.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of various embodiments of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

Having thus described embodiments of the disclosure of the present application in detail and by reference to illustrative embodiments thereof, it will be apparent that modifications and variations are possible without departing from the scope of the disclosure defined in the appended claims.

What is claimed is:

1. A system for selectively cooling a set of at least one rack-mounted server in a chassis, the system comprising:
   a chassis, wherein the chassis comprises racks to hold multiple rack-mounted servers;
   a chassis manager, wherein the chassis manager is a processor-based computing system;
   a set of at least one thermal sensor coupled to each rack-mounted server in the chassis, wherein the set of at least one thermal sensor communicates a real time temperature of each rack-mounted server from the multiple rack-mounted servers to the chassis manager;
   a cold air source;
   a cold air conduit in fluid communication with the cold air source;
   a plurality of cold air valves in fluid communication with the cold air conduit, wherein each of the plurality of cold air valves is positioned in functional proximity to a different server from the multiple rack-mounted servers; and
   an expandable tube of flexible memory material coupled to each of the plurality of cold air valves, wherein the expandable tube inflates with cold air from the cold air source to expose directional holes through a side of the expandable tube in response to a particular cold air valve opening, and wherein the directional holes direct the cold air across a specific predetermined sub-area of a particular overheating rack-mounted server, from the set of at least one rack-mounted server, in response to the chassis manager detecting that the particular overheating rack-mounted server is exceeding a predetermined temperature.

2. The system of claim 1, wherein the cold air conduit is a cold air plenum that provides fluid communication between the cold air source and all of the plurality of cold air valves.

3. The system of claim 1, wherein the cold air conduit is a cold air tube that provides fluid communication between the cold air source and one of the plurality of cold air valves.

4. The system of claim 1, further comprising:
a separate fluid moving fan coupled to each of the plurality of cold air valves, wherein each separate fluid moving fan pulls the cold air from the cold air source.

5. The system of claim 1, further comprising:
at least one cooling fan dedicated to a set of rack-mounted servers that includes the particular overheating rack-mounted server, wherein the at least one cooling fan nominally operates at a predetermined speed, wherein the at least one cooling fan is prevented by the chassis manager from increasing the predetermined speed unless a determination is made that the cold air is unable to bring the particular overheating rack-mounted server below the predetermined temperature.

6. A method of selectively cooling a set of at least one rack-mounted server in a chassis, the method comprising:
receiving, by one or more processors, a thermal reading from a set of at least one thermal sensor coupled to each rack-mounted server in a chassis, wherein the set of at least one thermal sensor communicates a real time temperature of each rack-mounted server from multiple rack-mounted servers to a chassis manager, wherein the chassis manager is a processor-based computing system;
detecting, by one or more processors, that a particular overheating rack-mounted server from the multiple rack-mounted servers is exceeding a predetermined temperature; and
in response to the chassis manager detecting that the particular overheating rack-mounted server is exceeding the predetermined temperature, generating and transmitting, by one or more processors, a message to open a cold air valve that is proximate to the particular overheating rack-mounted server, wherein the cold air valve selectively inflates an expandable tube of flexible memory material with cold air, from a cold air source, and wherein the expandable tube of flexible memory material directs the cold air to a specific predetermined sub-area of the particular overheating rack-mounted server in the chassis.

7. The method of claim 6, wherein the cold air is from a cold air plenum.

8. The method of claim 7, further comprising:
directing, by one or more processors, a cool air source to provide cooling air to the multiple rack-mounted servers via a cool air plenum, wherein the cool air plenum is in fluid communication with the cool air source, wherein the cool air plenum is oriented adjacent to the multiple rack-mounted servers, wherein the cool air plenum provides a primary source of cooling air to the multiple rack-mounted servers, and wherein the cold air plenum provides a secondary source of cooling air to the multiple rack-mounted servers.

9. The method of claim 6, wherein the cold air is from a cold air hose that is in fluid communication with the cold air valve.

10. The method of claim 6, wherein at least one cooling fan is dedicated to a set of rack-mounted servers that includes the particular overheating rack-mounted server, wherein the at least one cooling fan nominally operates at a predetermined speed, and wherein the method further comprises:
in response to the cold air delivered from the cold air source being able to bring the particular overheating rack-mounted server below the predetermined temperature, preventing, by one or more processors, the at least one cooling fan from increasing the predetermined speed.

11. A computer program product for selectively cooling a set of at least one rack-mounted server in a chassis, the computer program product comprising:
one or more computer-readable storage devices and program instructions stored on at least one of the one or more non-transitory computer-readable storage devices, the program instructions comprising:
program instructions to receive a thermal reading from a set of at least one thermal sensor coupled to each rack-mounted server in a chassis, wherein the set of at least one thermal sensor communicates a real time temperature of each rack-mounted server from multiple rack-mounted servers to a chassis manager, wherein the chassis manager is a processor-based computing system;
program instructions to detect that a particular overheating rack-mounted server from the multiple rack-mounted servers is exceeding a predetermined temperature; and
program instructions to, in response to the chassis manager detecting that the particular overheating rack-mounted server is exceeding the predetermined temperature, generate and transmit a message to open a cold air valve that is proximate to the particular overheating rack-mounted server, wherein the cold air valve selectively inflates an expandable tube of flexible memory material with cold air, from a cold air source, and wherein the expandable tube of flexible memory material directs the cold air to a specific predetermined sub-area of the particular overheating rack-mounted server in the chassis.

12. The computer program product of claim 11, wherein the cold air is from a cold air plenum.

13. The computer program product of claim 12, further comprising program instructions stored on at least one of the one or more computer-readable storage devices to:
direct a cool air source to provide cooling air to the multiple rack-mounted servers via a cool air plenum, wherein the cool air plenum is in fluid communication with the cool air source, wherein the cool air plenum is oriented adjacent to the multiple rack-mounted servers, wherein the cool air plenum provides a primary source of cooling air to the multiple rack-mounted servers, and wherein the cold air plenum provides a secondary source of cooling air to the multiple rack-mounted servers.

14. The computer program product of claim 11, wherein the cold air is from a cold air hose that is in fluid communication with the cold air valve.

15. The computer program product of claim 11, wherein at least one cooling fan is dedicated to a set of rack-mounted servers that includes the particular overheating rack-mounted server, wherein the at least one cooling fan nominally operates at a predetermined speed, and wherein the computer program product further comprises program instructions stored on at least one of the one or more computer-readable storage devices to:
in response to the cold air delivered from the cold air source being able to bring the particular overheating rack-mounted server below the predetermined temperature, prevent the at least one cooling fan from increasing the predetermined speed.

* * * * *